(12) United States Patent
Tayebati et al.

(10) Patent No.: US 7,630,425 B2
(45) Date of Patent: Dec. 8, 2009

(54) OPTICAL BEAM STEERING FOR TUNABLE LASER APPLICATIONS

(75) Inventors: Parviz Tayebati, Weston, MA (US); Kevin McCallion, Charlestown, MA (US); Duncan Walker, Somerville, MA (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 10/786,839

(22) Filed: Feb. 25, 2004

(65) Prior Publication Data

US 2005/0129072 A1    Jun. 16, 2005

Related U.S. Application Data

(60) Provisional application No. 60/449,917, filed on Feb. 25, 2003, provisional application No. 60/463,063, filed on Apr. 15, 2003.

(51) Int. Cl.
*H01S 3/08* (2006.01)

(52) U.S. Cl. ............................. 372/100; 372/9; 372/20; 372/23; 372/102; 359/831; 359/833; 359/837

(58) Field of Classification Search .................... 372/9, 372/23, 100, 102, 20; 359/831, 833, 837
See application file for complete search history.

(56) References Cited

U.S. PATENT DOCUMENTS

| | | | |
|---|---|---|---|
| 3,324,295 A | 6/1967 | Harris | |
| 3,999,105 A | 12/1976 | Archey et al. | |
| 4,038,600 A | 7/1977 | Thomas et al. | |
| 4,561,119 A | 12/1985 | Epworth | |
| 4,805,235 A | 2/1989 | Henmi | |
| 4,841,519 A | 6/1989 | Nishio | |
| 5,293,545 A | 3/1994 | Huber | |
| 5,325,378 A * | 6/1994 | Zorabedian | 372/20 |
| 5,371,625 A | 12/1994 | Wedding et al. | |
| 5,412,474 A | 5/1995 | Reasenberg et al. | |
| 5,416,629 A | 5/1995 | Huber | |
| 5,465,264 A | 11/1995 | Buhler et al. | |

(Continued)

FOREIGN PATENT DOCUMENTS

GB    2 107 147    4/1983

(Continued)

OTHER PUBLICATIONS

Alexander et al., Passive Equalization of Semiconductor Diode Laser Frequency Modulation, Journal of Lightwave Technology, Jan. 1989, 11-23, vol. 7, No. 1.

(Continued)

*Primary Examiner*—Minsun Harvey
*Assistant Examiner*—Tod T Van Roy
(74) *Attorney, Agent, or Firm*—Workman Nydegger

(57) ABSTRACT

Apparatus is disclosed for optically steering an optical beam, the apparatus comprising a pair of optical prism components arranged together with a diffraction grating so as to allow efficient coupling of an array of spectrally and spatially offset laser diodes to a common optical fiber. A method of optically steering at least one of a series of optical beams is disclosed, the method comprising providing a pair of optical prism components comprising a thermo-optic material; actuating at least one of the components so as to steer at least one of the series of optical beams received from an array of spatially and spectrally offset lasers.

15 Claims, 5 Drawing Sheets

U.S. PATENT DOCUMENTS

| | | | |
|---|---|---|---|
| 5,477,368 A | 12/1995 | Eskildsen et al. | |
| 5,550,667 A | 8/1996 | Krimmel et al. | |
| 5,592,327 A | 1/1997 | Gabl et al. | |
| 5,737,104 A | 4/1998 | Lee et al. | |
| 5,777,773 A | 7/1998 | Epworth et al. | |
| 5,805,235 A | 9/1998 | Bedard | |
| 5,856,980 A | 1/1999 | Doyle et al. | |
| 5,920,416 A | 7/1999 | Beylat et al. | |
| 5,953,139 A | 9/1999 | Nemecek et al. | |
| 5,974,209 A | 10/1999 | Cho et al. | |
| 6,081,361 A | 6/2000 | Adams et al. | |
| 6,096,496 A | 8/2000 | Frankel | |
| 6,104,851 A | 8/2000 | Mahgerefteh | |
| 6,115,403 A | 9/2000 | Brenner et al. | |
| 6,222,861 B1 | 4/2001 | Kuo et al. | |
| 6,271,959 B1 | 8/2001 | Kim et al. | |
| 6,298,186 B1 | 10/2001 | He | |
| 6,331,991 B1 | 12/2001 | Mahgerefteh | |
| 6,359,716 B1 | 3/2002 | Taylor | |
| 6,473,214 B1 | 10/2002 | Roberts et al. | |
| 6,506,342 B1 | 1/2003 | Frankel | |
| 6,563,623 B1 | 5/2003 | Penninckx et al. | |
| 6,577,013 B1 | 6/2003 | Glenn et al. | |
| 6,618,513 B2 | 9/2003 | Evankow, Jr. | |
| 6,654,564 B1 | 11/2003 | Colbourne et al. | |
| 6,665,351 B2 | 12/2003 | Hedberg | |
| 6,748,133 B2 | 6/2004 | Liu et al. | |
| 6,778,307 B2 | 8/2004 | Clark | |
| 6,810,047 B2 * | 10/2004 | Oh et al. | 372/20 |
| 6,834,134 B2 | 12/2004 | Brennan et al. | |
| 6,836,487 B1 * | 12/2004 | Farmer et al. | 372/3 |
| 6,847,758 B1 | 1/2005 | Watanabe | |
| 6,947,206 B2 | 9/2005 | Tsadka et al. | |
| 6,963,685 B2 | 11/2005 | Mahgerefteh et al. | |
| 7,013,090 B2 | 3/2006 | Adachi et al. | |
| 7,054,538 B2 | 5/2006 | Mahgerefteh et al. | |
| 7,076,170 B2 | 7/2006 | Choa | |
| 7,123,846 B2 | 10/2006 | Tateyama et al. | |
| 7,263,291 B2 | 8/2007 | Mahgerefteh et al. | |
| 7,280,721 B2 | 10/2007 | McCallion et al. | |
| 2002/0154372 A1 | 10/2002 | Chung et al. | |
| 2002/0159490 A1 | 10/2002 | Karwacki | |
| 2002/0176659 A1 | 11/2002 | Lei et al. | |
| 2003/0002120 A1 | 1/2003 | Choa | |
| 2003/0067952 A1 | 4/2003 | Tsukiji et al. | |
| 2003/0099018 A1 | 5/2003 | Singh et al. | |
| 2003/0147114 A1 | 8/2003 | Kang et al. | |
| 2003/0193974 A1 * | 10/2003 | Frankel et al. | 372/20 |
| 2004/0008933 A1 | 1/2004 | Mahgerefteh et al. | |
| 2004/0008937 A1 | 1/2004 | Mahgerefteh et al. | |
| 2004/0036943 A1 | 2/2004 | Freund et al. | |
| 2004/0096221 A1 | 5/2004 | Mahgerefteh et al. | |
| 2004/0218890 A1 | 11/2004 | Mahgerefteh et al. | |
| 2005/0100345 A1 | 5/2005 | Welch et al. | |
| 2005/0111852 A1 | 5/2005 | Mahgerefteh et al. | |
| 2005/0175356 A1 | 8/2005 | McCallion et al. | |
| 2005/0206989 A1 | 9/2005 | Marsh | |
| 2005/0271394 A1 | 12/2005 | Whiteaway et al. | |
| 2005/0286829 A1 | 12/2005 | Mahgerefteh et al. | |
| 2006/0002718 A1 | 1/2006 | Matsui et al. | |
| 2006/0018666 A1 | 1/2006 | Matsui et al. | |
| 2006/0029358 A1 | 2/2006 | Mahgerefteh et al. | |
| 2006/0029396 A1 | 2/2006 | Mahgerefteh et al. | |
| 2006/0029397 A1 | 2/2006 | Mahgerefteh et al. | |
| 2006/0228120 A9 | 10/2006 | McCallion et al. | |
| 2006/0233556 A1 | 10/2006 | Mahgerefteh et al. | |
| 2006/0274993 A1 | 12/2006 | Mahgerefteh et al. | |

FOREIGN PATENT DOCUMENTS

| | | |
|---|---|---|
| WO | 9905804 | 2/1999 |
| WO | 0104999 | 1/2001 |
| WO | 03005512 | 1/2003 |

OTHER PUBLICATIONS

Binder, J. et al., 10 Gbit/s-Dispersion Optimized Transmission at 1.55 um Wavelength on Standard Single Mode Fiber, IEEE Photonics Technology Letters, Apr. 1994, 558-560, vol. 6, No. 4.

Corvini, P.J. et al., Computer Simulation of High-Bit-Rate Optical Fiber Transmission Using Single-Frequency Lasers, Journal of Lightwave Technology, Nov. 1987, 1591-1596, vol. LT-5, No. 11.

Hyryniewicz, J.V., et al., Higher Order Filter Response in Coupled MicroRing Resonators, IEEE Photonics Technology Letters, Mar. 2000, 320-322, vol. 12, No. 3.

Koch, T. L. et al., Nature of Wavelength Chirping in Directly Modulated Semiconductor Lasers, Electronics Letters, Dec. 6, 1984, 1038-1039, vol. 20, No. 25/26.

Kurtzke, C., et al., Impact of Residual Amplitude Modulation on the Performance of Dispersion-Supported and Dispersion-Mediated Nonlinearity-Enhanced Transmission, Electronics Letters, Jun. 9, 1994, 988, vol. 30, No. 12.

Lee, Chang-Hee et al., Transmission of Directly Modulated 2.5-Gb/s Signals Over 250-km of Nondispersion-Shifted Fiber by Using a Spectral Filtering Method, IEEE Photonics Technology Letters, Dec. 1996, 1725-1727, vol. 8, No. 12.

Li, Yuan P., et al., Chapter 8: Silicon Optical Bench Waveguide Technology, Optical Fiber Communications, 1997, 319-370, vol. 111B, Lucent Technologies, New York.

Little, Brent E., Advances in MicroRing Resonators, Integrated Photonics Research Conference 2003.

Mohrdiek, S. et al., 10-Gb/s Standard Fiber Transmission Using Directly Modulated 1.55-um Quantum-Well DFB Lasers, IEEE Photonics Technology Letters, Nov. 1995, 1357-1359, vol. 7, No. 11.

Morton, P.A. et al., "38.5km error free transmission at 10Gbit/s in standard fibre using a low chirp, spectrally filtered, directly modulated 1.55um DFB laser", Electronics Letters, Feb. 13, 1997, vol. 33(4).

Prokais, John G., Digital Communications, 2001, 202-207, Fourth Edition, McGraw Hill, New York.

Rasmussen, C.J., et al., Optimum Amplitude and Frequency-Modulation in an Optical Communication System Based on Dispersion Supported Transmission, Electronics Letters, Apr. 27, 1995, 746, vol. 31, No. 9.

Shalom, Hamutal et al., On the Various Time Constants of Wavelength Changes of a DFB Laser Under Direct Modulation, IEEE Journal of Quantum Electronics, Oct. 1998, pp. 1816-1822, vol. 34, No. 10.

Wedding, B., Analysis of fibre transfer function and determination of receiver frequency response for dispersion supported transmission, Electronics Letters, Jan. 6, 1994, 58-59, vol. 30, No. 1.

Wedding, B., et al., 10-Gb/s Optical Transmission up to 253 km Via Standard Single-Mode Fiber Using the Method of Dispersion-Supported Transmission, Journal of Lightwave Technology, Oct. 1994, 1720, vol. 12, No. 10.

Yu, et al., Optimization of the Frequency Response of a Semiconductor Optical Amplifier Wavelength Converter Using a Fiber Bragg Grating, Journal of Lightwave Technology, Feb. 1999, 308-315, vol. 17, No. 2.

Matsui, Yasuhiro et al, Chirp-Managed Directly Modulated Laser (CML), IEEE Photonics Technology Letters, Jan. 15, 2006, pp. 385-387, vol. 18, No. 2.

Nakahara, K. et al, 40-Gb/s Direct Modulation With High Extinction Ratio Operation of 1.3-μm InGaA 1 As Multiquantum Well Ridge Waveguide Distributed Feedback Lasers, IEEE Photonics Technology Leters, Oct. 1, 2007, pp. 1436-1438, vol. 19 No. 19.

Sato, K. et al, Chirp Characteristics of 40-Gb/s Directly Modulated Distributed-Feedback Laser Diodes, Journal of Lightwave Technology, Nov. 2005, pp. 3790-3797, vol. 23, No. 11.

Ucolick.org: Phillips' Figures for LRIS ADC [retrieved Aug. 20, 2008 from the internet] http://www.ucolick.org/~phillips/adc/.

* cited by examiner

OPTICAL BEAM STEERING FOR TUNABLE LASER APPLICATIONS

REFERENCE TO PENDING PRIOR PATENT APPLICATIONS

This patent application claims benefit of:

(1) pending prior U.S. Provisional Patent Application Ser. No. 60/449,917, filed Feb. 25, 2003 by Kevin McCallion et al. for OPTICAL BEAM STEERING FOR TUNABLE LASER APPLICATIONS; and (2) pending prior U.S. Provisional Patent Application Ser. No. 60/463,063, filed Apr. 15, 2003 by Parviz Tayebati et al. for OPTICAL BEAM STEERING FOR TUNABLE LASER APPLICATIONS.

The two aforementioned patent applications are hereby incorporated herein by reference.

FIELD OF THE INVENTION

This invention has applications in telecommunications and spectroscopy.

BACKGROUND OF THE INVENTION

The emergence of DWDM technology as a viable solution to bandwidth bottlenecks in current and future optical networks has generated a need for spectrally tunable optical components. In particular, tunable laser sources that can be deployed along with high speed, intensity modulator components are required. Several different technologies and approaches have been adopted in an effort to provide a low-cost, high performance, tunable laser sources that meet the specifications called for by today's network operators.

A number of tunable laser implementations make use of micro-electro-mechanical systems (MEMS) for their successful operation. These include ECLs and DFB arrays where a mechanical adjustment allows selection of the desired laser wavelength. The DFB array approach has particular attractions in that well-understood, reliable DFB laser technology is used, albeit in array form. In this implementation, up to 12 DFBs are fabricated on the same chip with a separation of around 10 μm between adjacent lasers. The center wavelength, at fixed temperature, is offset by approximately 3 nm between adjacent lasers and each laser can be temperature tuned to cover 3 nm. Thus, full C band tuning can be realized by selectively tuning the lasers within their local thermal range and switching to the adjacent laser as required.

However, the spatial offset of the individual lasers within the array makes efficient coupling to a single optical fiber difficult. A single lens can be used to collect and collimate the light from each of the DFB laser sources but the spatial offset results in a varying angle on the collimated beam. This leads to a spatial offset when the beams are focused onto a single optical fiber that is located in a fixed position in the focal plane of a second lens. Thus, efficient coupling can only be obtained for the DFB laser at the center of the array.

The above situation can be remedied by incorporating a beam steering element in the optical path between a collimating lens and a focus lens. Typically, this could be a MEMS mirror that can be electro-statically tuned via application of a control voltage. This approach suffers from vibration issues that are known to plague MEMS type implementations.

As a result, one object of this invention is to provide a low cost, low power consumption, multiplexing solution to coupling of an array of DFB lasers (spatially and spectrally offset). The described approach removes the need for a complicated MEMS beam steering mirror and reduces sensitivity to vibration effects, etc.

DESCRIPTION OF THE INVENTION

Beam Steering Using Thermo-optic Prism

As described by the present invention, a thermally tuned beam steering element can be used in the optical path. A prism fabricated from a thermo-optic material can effectively act as an optical beam steering element by controlling the temperature. This beam steering element can be incorporated into various optical subassemblies to provide improved functionality e.g. wavelength tunable lasers.

This approach allows lower cost and simpler implementation while avoiding vibration-induced detrimental effects.

More particularly, by inserting a prism into the collimated beam path, it is possible to vary the angle of the beam by changing the refractive index of the prism material. Preferably, this can be done in an isotropic fashion by using a high dn/dT material such as a crystalline semiconductor such as Silicon, Gallium Arsenide or Indium Phosphide. Silicon is particularly convenient due to its ease of processing and low optical loss in the 1550 nm region when in pure, un-doped crystalline form. FIG. 1 shows the beam steering function of the prism.

It can be shown that the following equation holds for the prism beam steering function:

$$\sin\theta_4 = \sin\alpha\sqrt{n^2 - \sin^2\theta_1} - \cos\alpha\sin\theta_1$$

The above equation shows that the exit angle of the beam is dependent on the input angle, the prism angle and the refractive index of the prism material. For practical use, the refractive index can be varied via the thermo-optic effect. As an example, the graph shown in FIG. 2 shows a plot of the output angle variation that can be achieved via temperature control of the prism.

FIG. 2 shows that a significant amount of beam steering can be achieved for around 50° C. of temperature variation. However, the beam size and shape (and aberration) is also affected by the prism and should be considered in a practical design/implementation.

Beam Size & Quality

Upon passing through the prism interfaces, the beam width in the horizontal direction is magnified according to the equation below:

$$M = \frac{\cos\theta_2}{\cos\theta_1}\frac{\cos\theta_4}{\cos\theta_3}$$

where the angles are defined as in FIG. 1.

Passing the beam through the steering prism causes aberration and beam quality degrades, leading to a reduction in fiber coupling efficiency. This problem can be avoided by passing the beam through a second "correction" prism to "undo" the aberration. This restores the original optical beam shape and quality but the beam angle variation still remains. The design of the second "correction" prism (located either before or after the diffraction grating) can be arranged that it corrects for aberration induced by the steering prism plus aberration/beam shaping induced by the grating itself.

A typical implementation uses crystalline Silicon as the prism material with anti-reflection coatings on the interacting surfaces. Temperature control of the prism is efficiently achieved by mounting the prism onto a thermally insulative base that has been patterned with a metal strip heater. A thermistor is located on the top surface of the prism to allow temperature monitoring and feedback. The power consumption can be minimized by keeping the dimensions of the prism as small as possible for the given optical beam size. Angles of incidence and exit also have an impact on possible prism dimensions.

Other Component Applications

Other potential component implementations can be developed based on the optical beam steering element. These include variable optical attenuators, beam shutters, tunable filters, and other external cavity laser designs (using SOA as gain medium).

BRIEF DESCRIPTION OF THE DRAWINGS

These and other objects and features of the present invention will be more fully disclosed or rendered obvious by the following detailed description of the preferred embodiments of the invention, which is to be considered together with the accompanying drawings wherein.

DETAILED DESCRIPTION OF THE PREFERRED EMBODIMENTS

A preferred embodiment that uses the optical beam steering element is in a tunable laser design that is based on a DFB laser array.

Tunable Laser Implementation

Figure 1:
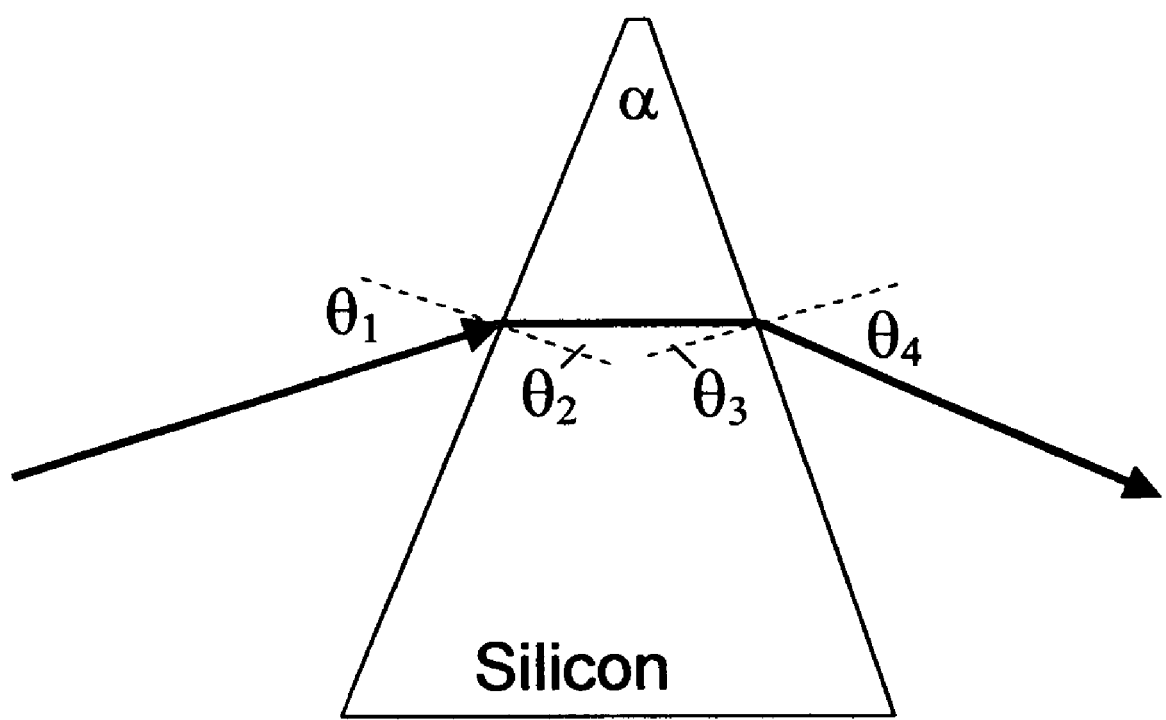
FIG. 1 is a schematic diagram of a prism beam steering element.
Figure 2:
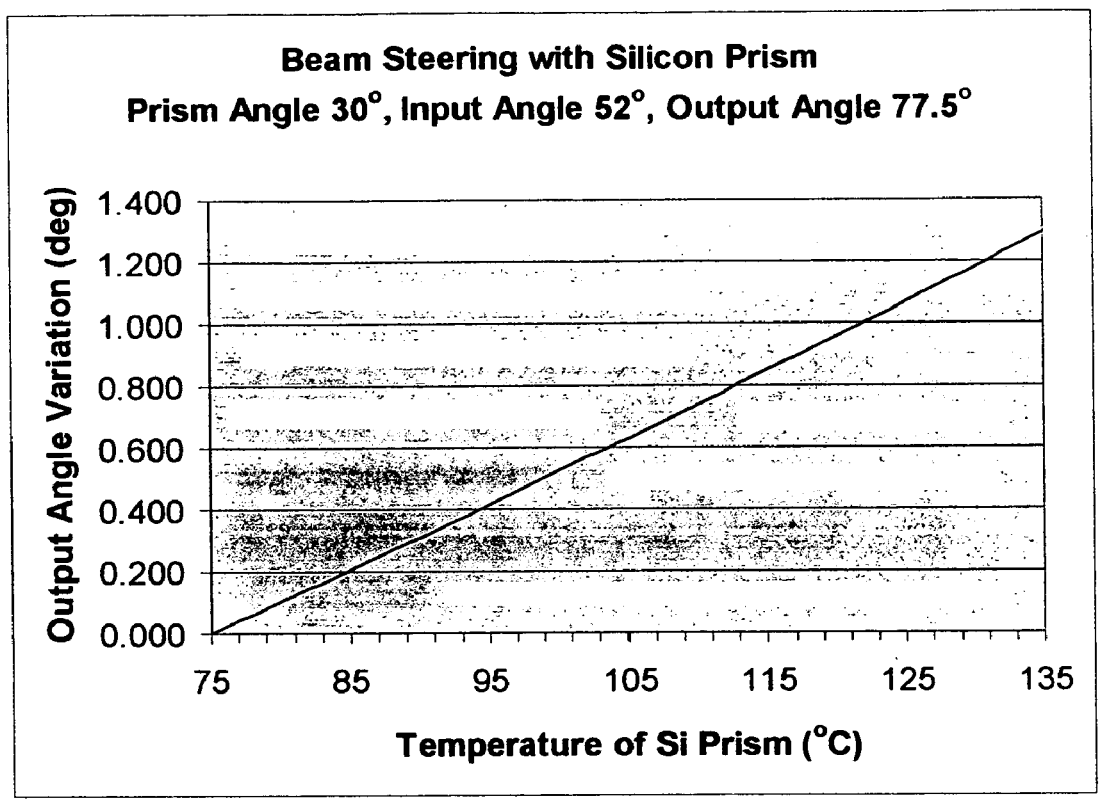
FIG. 2 is a graph showing temperature induced beam steering.
Figure 3:
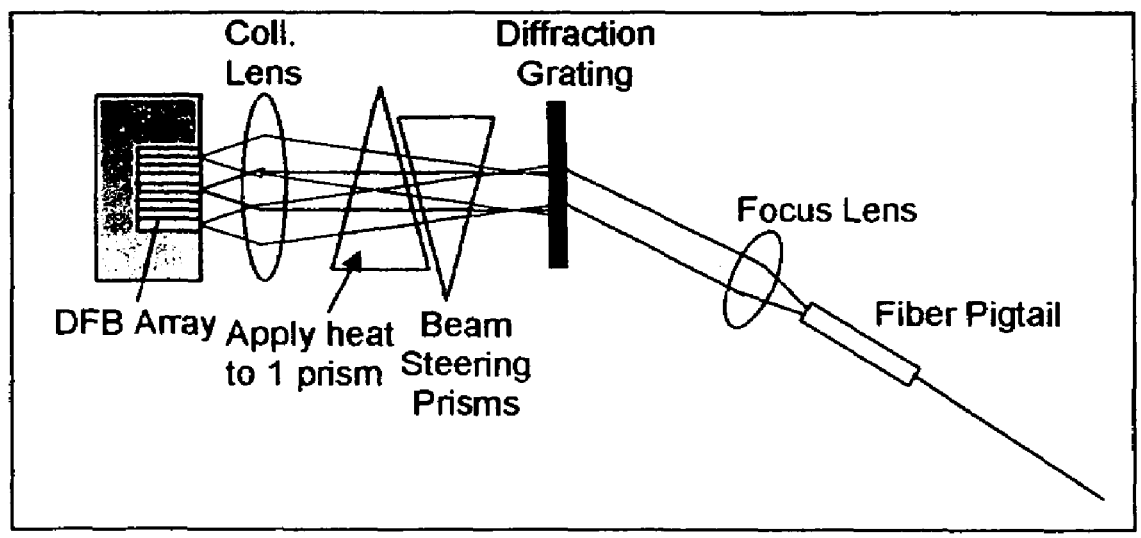
FIG. 3 is a schematic diagram showing a tunable laser based on a DFB array, beam steering prism and diffraction grating (transmission, reflection grating or hologram)(each DFB laser is thermally tuned over 400 GHz)

An optical beam steering approach as applied to a tunable laser based on a DFB array is shown in FIG. 3.

The principle of operation is based on spatial multiplexing of the light emitted by each individual DFB array element (different emission wavelengths) using the diffraction grating. The grating is designed to multiplex the array elements for a set condition of wavelengths and array pitch. The function of the beam steering prism is to compensate for the shift in wavelength when each DFB array element is tuned by varying the temperature of the laser.

From FIG. 3, the offset of the DFB array elements from the center element results in a slight beam angle after the collimation lens, with respect to the center element. Typically, for an array pitch of 10 um and array size of 12 DFB lasers, the elements at the extremes of the array are physically separated from the center element by 50 µm. For an even number of elements on a 10 µm pitch, there is a further 5 µm offset from the spatial center of the array. Therefore, the outlying DFB elements are 55 µm from geometrical center. If a 3 mm focal length collimating lens is used, the approximate angle of the collimated beams relative to the optical axis of the lens, is given by $\tan(\theta)=55/3000$ with $\theta=1.05°$. For adjacent DFB elements, the resultant angular dispersion is $\delta\lambda/\delta\theta=3$ nm/$\tan^{-1}(10/3000)=900$ nm/rad.

The DFB array is designed such that the emission wavelength of each element is offset from its nearest neighbor by 3 nm. Thus, a 12 DFB array can cover a spectral range of 36 nm, assuming that each individual element is capable of tuning 3 nm via temperature variation. The spatial (resulting in beam angle) and spectral offset between adjacent array elements can be used to design a grating that compensates for the beam angle induced by the collimating lens.

Diffraction Grating Options

The invention can be implemented using a range of diffraction grating options: (1) transmission type, (2) reflection type, or (3) hologram type. Types 1 and 2 are generally surface relief style geometries. Type 3 is fabricated by inducing spatially-dependent refractive index changes within a transparent material (often a crystalline material).

The well-known equation for a grating is:

$$m\lambda = d(\sin\alpha + \sin\beta) \quad (1)$$

where m is the diffracted order, $\lambda$ is the incident wavelength, d is the spacing between adjacent grooves on the grating surface, $\alpha$ is the angle of incidence and $\beta$ is the diffracted angle.

For the arrangement shown in FIG. 3, the incident angle is normal to the grating and the equation above collapses to:

$$m\lambda = d\sin\beta \quad (2)$$

To perform the necessary multiplexing function required as described above, the angular dispersion of the grating should satisfy the relation below:

$$\frac{\partial\lambda}{\partial\beta} = \frac{d}{m}\cos\beta = 900 \quad (3)$$

where units are in nm/rad

Transmission Grating Implementation

Figure 3A:
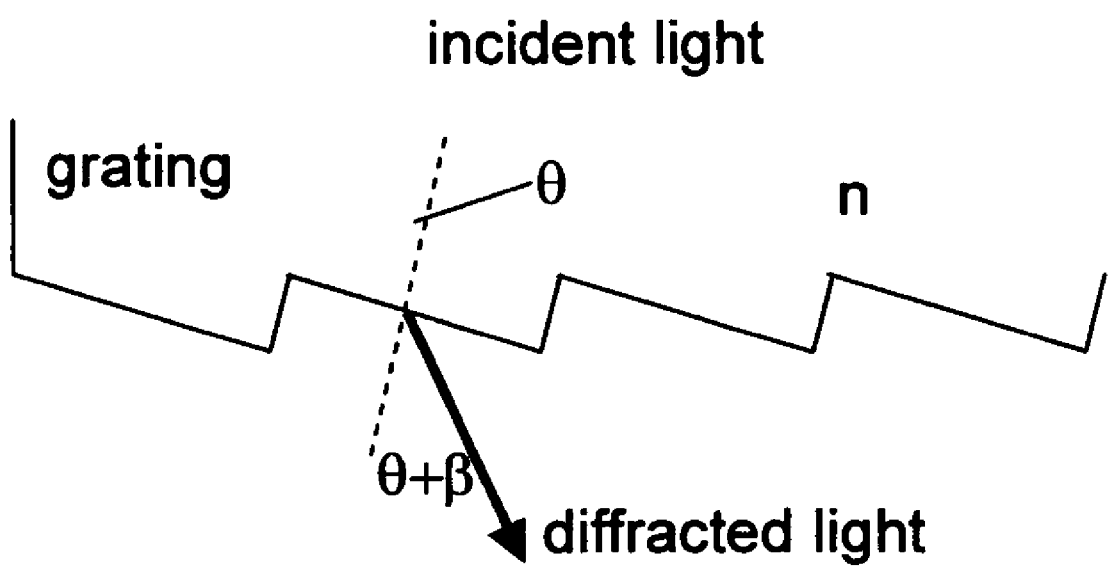
FIG. 3A is a schematic diagram showing diffraction with a grating.

This matches the angular dispersion from the DFB array combined with collimating lens. Using equations (2) and (3), and a center wavelength of 1550 nm, the value of $\beta$ is calculated as 59.9°. i.e. the transmitted beam exits the grating at a nominal angle of 59.9°. The most efficient operation of the grating occurs when the refraction of the mini-prism that constitutes a groove (in the grating) lies in the same direction as the diffraction given by the grating equation. Applying Snell's Law to the interface between the groove facet and air (see FIG. 3A), the following equation holds:

$$n\sin\theta = \sin(\theta+\beta) \quad (4)$$

where n is the refractive index of the grating material.

Combining the grating equation and Snell's law provides the relationship between the blaze angle $\beta_B$ and the groove angle $\theta$:

$$\tan\theta = \frac{\sin\beta_B}{n - \cos\beta_B} \quad (5)$$

The transmission grating design for the preferred embodiment can be derived from the above equations.

Reflection Grating Implementation

Figure 4:
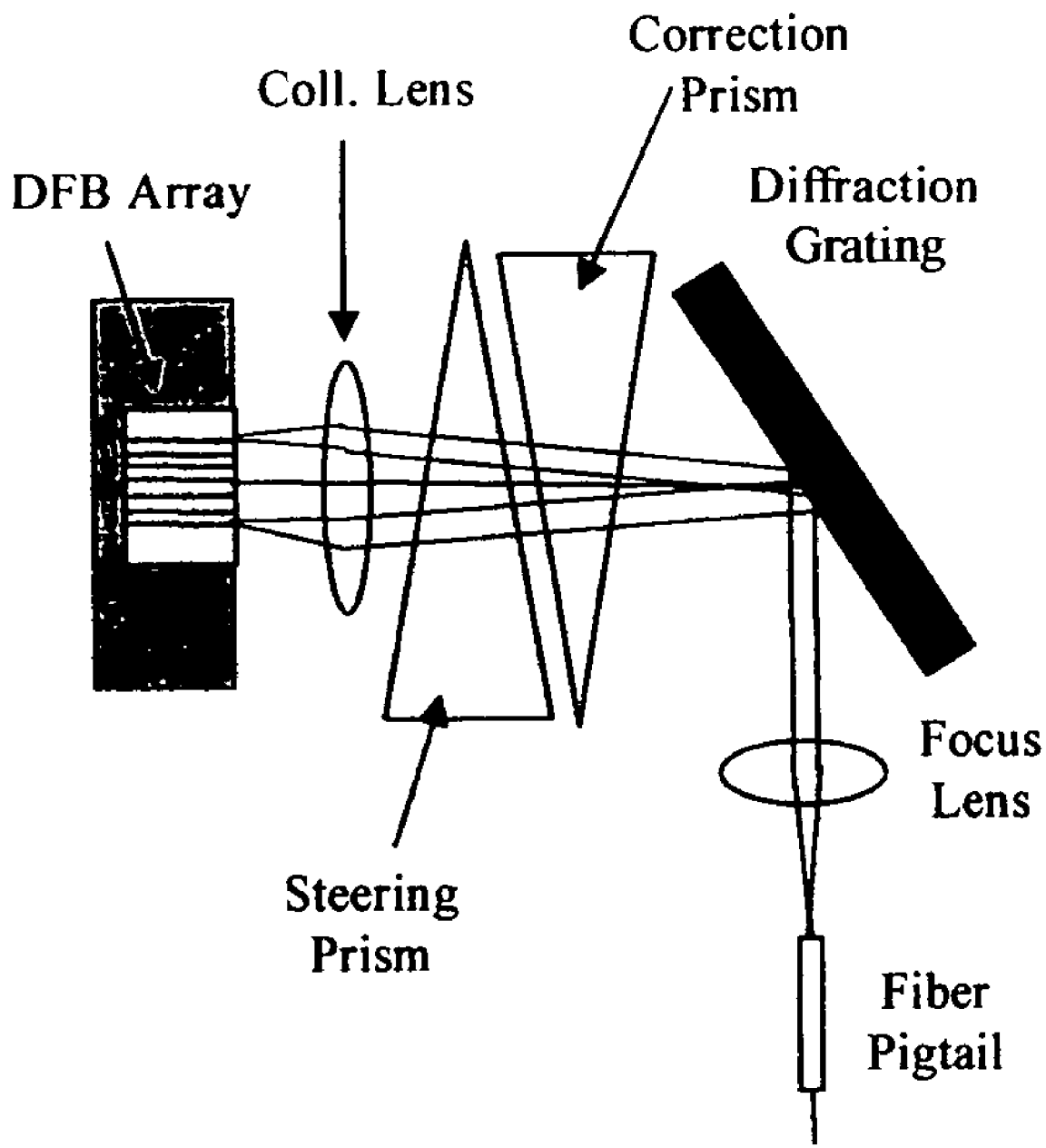
FIG. 4 is a schematic diagram showing a tunable laser with a reflection grating.

FIG. 4 shows the invention implemented with a reflection-style diffraction grating. For this implementation, a typical geometry could use an angle of incidence of 30° to the grating with a diffracted angle of around 68.5°. Beam aberration can be corrected with a prism prior to coupling to optical fiber.

Holographic Grating Implementation

The invention could also be implemented using a holographically written (formed) grating with a similar geometry to the transmission grating described above.

Modifications of the Preferred Embodiments

A modification to the preferred embodiment uses an optical beam steering prism alone (with no grating component) to compensate for spatial/spectral offset of two or more DFB array elements. In this case, the prism beam steering element is required to compensate for angular deviation of 0.2° per DFB array element. Multiplexing of up to 3 array elements should be possible with a reasonable amount of electrical power consumption for the heater and no significant degradation in coupling efficiency. This assumes that the effect of refractive index dispersion of Silicon is negligible.

Alternative tuning mechanisms: In addition to thermo-optical effects which steers the direction of the beam of light we also claim the use of prisms made of electro-optic and magneto-optic materials to achieve the same. In electro-optic approach an electrical voltage could be applied to the prism (made out of materials such as $LiNbO_3$, $Sr_xBa_{1-x}Nb_2O_3$ (SBN:x) etc. The voltage can be applied to any two surfaces to induce an electro-optic index change. Similarly the prism may be made of magneto-optic materials whose effective index of refraction could be changed by applying a magnetic field to the material via a coil adjacent to the prism.

Advantages of the Invention

Numerous advantages of the present invention will be apparent to those skilled in the art. Among other things, the advantages of the invention include low cost, simple implementation, beam steering with no moving parts, low power consumption (related to prism size, material, etc.). These advantages lead to cost savings and performance enhancement in tunable laser systems based around the prism optical beam steering element.

What is claimed is:

1. A system for generating light at a variety of wavelengths and directing the same along a common axis, comprising:
    a plurality of tunable lasers, each of the tunable lasers having a different base wavelength and being tunable therefrom, and each of the tunable lasers being spatially offset from one another;
    a grating for receiving the light from each of the spatially offset tunable lasers and directing the same along a common axis, wherein the grating is configured so that when each of the spatially offset tunable lasers is radiating light at its base wavelength, the grating redirects the light from each of the spatially offset tunable lasers along the common axis;
    a first thermo-optic prism positioned between the plurality of tunable lasers and the grating for steering the light from each of the spatially offset tunable lasers so that when the spatially offset tunable lasers are tuned so as to generate light at an adjusted wavelength which is different from its base wavelength, the first thermo-optic prism will direct the light from each of the spatially offset tunable lasers into the grating at an angle which compensates for the difference between the adjusted wavelength and the base wavelength so that the light from that laser will emerge from the grating along the common axis, wherein a thermistor is located on a top surface of the first thermo-optic prism for temperature monitoring; and
    a second prism positioned between the first thermo-optic prism and the grating, the second prism arranged to correct an aberration introduced by the first thermo-optic prism in order to restore the quality and shape of the light from each of the spatially offset tunable lasers;
    wherein the system is configured so that the light from each of the spatially offset tunable lasers is directed through the first thermo-optic prism, then through the second thermo-optic prism, and then into the grating for redirecting the light along the common axis; and
    wherein the first and second prism each include first and second faces that are angled with respect to one another, wherein the first face of the first prism is parallel the first face of the second prism and wherein the second face of the first prism is parallel to the second face of the second prism.

2. A system according to claim 1 wherein the system further comprises a collimating lens positioned after the plurality of tunable lasers and before the first thermo-optic prism.

3. A system according to claim 1 wherein the system further comprises a focus lens positioned after the grating.

4. A system according to claim 1 wherein the system further comprises an optical fiber for receiving the light from the grating.

5. A system according to claim 1 wherein the first thermo-optic prism further comprises adjustment means for adjusting the temperature of the first thermo-optic prism so as to adjustably steer the optical beam.

6. A system according to claim 5 wherein the adjustment means comprise at least one selected from a group consisting of heat, an electric field, and a magnetic field.

7. A system according to claim 1 wherein the plurality of tunable lasers comprises at least 12 tunable lasers.

8. A system for generating light at a variety of wavelengths and directing the same along a common axis, comprising:
    a plurality of tunable lasers, each of the tunable lasers having a different base wavelength and being tunable therefrom, and each of the tunable lasers being spatially offset from one another;
    a grating for receiving the light from each of the spatially offset tunable lasers and directing the same along a common axis, wherein the grating is configured so that when each of the spatially offset tunable lasers is radiating light at its base wavelength, the grating redirects the light from each of the spatially offset tunable lasers along the common axis;
    a first thermo-optic prism positioned between the plurality of tunable lasers and the grating for steering the light from each of the spatially offset tunable lasers so that when the spatially offset tunable lasers are tuned so as to generate light at an adjusted wavelength which is different from its base wavelength, the first thermo-optic prism will direct the light from each of the spatially offset tunable lasers into the grating at an angle which compensates for the difference between the adjusted wavelength and the base wavelength so that the light from that laser will emerge from the grating along the common axis, wherein a thermistor is located on a top surface of the first thermo-optic prism for temperature monitoring;

a second prism positioned after the grating and arranged to correct an aberration introduced by the first thermo-optic prism in order to restore the quality and shape of the light from each of the spatially offset tunable lasers;

wherein the system is configured so that the light from each of the spatially offset tunable lasers is directed through the first thermo-optic prism, then into the grating for redirecting the light along the common axis, and then through the second thermo-optic prism; and wherein the first and second prism each have a triangle shape including first and second faces that are angled with respect to one another, wherein the first face of the first prism is parallel the first face of the second prism and wherein the second face of the first prism is parallel to the second face of the second prism.

9. A system according to claim 8 wherein the system further comprises a collimating lens positioned after the plurality of tunable lasers and before the first thermo-optic prism.

10. A system according to claim 8 wherein the system further comprises a focus lens positioned after the grating.

11. A system according to claim 8 wherein the system further comprises an optical fiber for receiving the light from the grating.

12. A system according to claim 8 wherein the first thermo-optic prism further comprises adjustment means for adjusting the temperature of the first thermo-optic prism so as to adjustably steer the optical beam.

13. A system according to claim 12 wherein the adjustment means comprise at least one selected from a group consisting of heat, an electric field, and a magnetic field.

14. A system according to claim 8 wherein the plurality of tunable lasers comprises at least 12 tunable lasers.

15. A system for generating light at a variety of wavelengths and directing the same along a common axis, comprising:

a plurality of tunable lasers, each of the tunable lasers having a different base wavelength and being tunable therefrom, and each of the tunable lasers being spatially offset from one another;

an input lens positioned to receive light from the lasers and to output a collimated beam;

a first prism having a triangular shape positioned to receive the collimated beam and output a first angularly shifted beam having a larger size than the collimated beam;

a second prism formed of the same material as the first prism and having a triangular shape positioned to receive the first angularly shifted beam and output a second angularly shifted beam, the second prism arranged to correct an aberration introduced by the first thermo-optic prism in order to restore the quality and shape of the light from each of the spatially offset tunable lasers;

an output lens positioned to receive the second angularly shifted beam and output an output beam directed onto an optical fiber;

a tuning heater in thermal contact with the first prism; and a controller coupled to the tuning heater and programmed to control power supplied to the tuning heater in order to change an index of refraction of the first prism;

wherein the first and second prism each have first and second faces that are angled with respect to one another, wherein the first face of the first prism is parallel the first face of the first prism and wherein the second face of the first prism is parallel to the second face of the second prism.

* * * * *